(12) United States Patent
Yamada et al.

(10) Patent No.: US 11,581,168 B2
(45) Date of Patent: Feb. 14, 2023

(54) PLASMA PROCESSING APPARATUS AND METHOD

(71) Applicant: TOKYO ELECTRON LIMITED, Tokyo (JP)

(72) Inventors: Kazuhito Yamada, Miyagi (JP); Hiroki Endo, Miyagi (JP); Takashi Sato, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/586,551

(22) Filed: Jan. 27, 2022

(65) Prior Publication Data

US 2022/0148860 A1 May 12, 2022

Related U.S. Application Data

(63) Continuation of application No. 16/905,422, filed on Jun. 18, 2020, now Pat. No. 11,239,062.

(30) Foreign Application Priority Data

Jun. 21, 2019 (JP) .............................. JP2019-115282

(51) Int. Cl.
*H01J 37/32* (2006.01)
(52) U.S. Cl.
CPC .. *H01J 37/32724* (2013.01); *H01J 37/32146* (2013.01); *H01J 2237/2001* (2013.01)

(58) Field of Classification Search
CPC ..................... H01J 37/32724; H01J 37/32146
See application file for complete search history.

(56) References Cited

U.S. PATENT DOCUMENTS 10,431,433 B2 10/2019 Nagami et al.

FOREIGN PATENT DOCUMENTS

JP 2019-004027 A 1/2019

*Primary Examiner* — Joseph L Williams
(74) *Attorney, Agent, or Firm* — Weihrouch IP

(57) ABSTRACT

A plasma processing apparatus includes a chamber; a substrate support having a lower electrode, an electrostatic chuck, and a heater; a radio frequency power supply; a DC power supply; a first controller; and a second controller. The first controller controls the radio frequency power supply to supply a pulsed radio frequency power to the lower electrode periodically with a cycle defined by a first frequency, and controls the DC power supply to apply a pulsed negative voltage to the edge ring periodically with the cycle. The second controller includes a heater controller that controls the power by obtaining a resistance value of the heater from sample values of a current and a voltage supplied to the heater. The first frequency is different from a second frequency that is a sampling frequency of the sample value of the current and the sample value of the voltage in the second controller.

10 Claims, 5 Drawing Sheets

PLASMA PROCESSING APPARATUS AND METHOD

CROSS-REFERENCE TO RELATED APPLICATIONS

This application is a continuation of U.S. application Ser. No. 16/905,422 filed Jun. 18, 2020, which claims priority to Japanese Patent Application No. 2019-115282, filed on Jun. 21, 2019, respectively, all of which are incorporated herein in their entirety by reference and priority is claimed to each.

TECHNICAL FIELD

The present disclosure relates to a plasma processing apparatus and method.

BACKGROUND

A plasma processing apparatus is used for performing plasma processing on a substrate. The plasma processing apparatus includes a chamber, a substrate support, and a radio frequency power supply. The substrate support is disposed in the chamber. The substrate support includes a lower electrode and an electrostatic chuck. The electrostatic chuck is disposed on the lower electrode. An edge ring is disposed on the substrate support. The substrate is mounted on the electrostatic chuck and in a region surrounded by the edge ring. A radio frequency power is supplied from the radio frequency power supply to the lower electrode in order to perform the plasma processing. A pulsed radio frequency power may be periodically supplied from the radio frequency power supply to the lower electrode.

When the plasma processing is performed, the edge ring is consumed and a thickness of the edge ring is reduced. When the thickness of the edge ring is reduced, a position of an upper end of a sheath above the edge ring is lowered. Accordingly, ions are obliquely supplied from plasma to an edge of the substrate. In order to correct the position of the upper end of the sheath above the edge ring, a technique in which a negative voltage is applied to the edge ring has been suggested. This technique is disclosed in Japanese Patent Application Publication No. 2019-4027. In the technique disclosed in Publication No. 2019-4027, a negative voltage is applied to the edge ring during a period in which the pulsed radio frequency power is supplied to the lower electrode.

There is a demand for improving the accuracy of controlling a temperature of a heater disposed in the electrostatic chuck of the plasma processing apparatus.

SUMMARY

In accordance with an aspect of the present disclosure, there is provided a plasma processing apparatus including: a chamber; a substrate support disposed in the chamber and including a lower electrode, an electrostatic chuck disposed on the lower electrode, and at least one heater that is a resistance heating element disposed in the electrostatic chuck; a radio frequency power supply electrically connected to the lower electrode; a DC power supply configured to apply a negative voltage to an edge ring disposed on the substrate support; a first controller configured to control the radio frequency power supply and the DC power supply; and a second controller configured to control a power supplied from a heater power supply to the heater such that a difference between a current temperature and a set temperature of the heater is reduced. Further, the first controller controls the radio frequency power supply to supply a pulsed radio frequency power to the lower electrode periodically with a cycle defined by a first frequency, and controls the DC power supply to apply a pulsed negative voltage to the edge ring periodically with the cycle. The second controller includes a heater controller configured to control the power by obtaining a resistance value of the heater from a sample value of a current supplied to the heater and a sample value of a voltage applied to the heater and determining the current temperature from the resistance value. The first frequency is different from a second frequency that is a sampling frequency of the sample value of the current and the sample value of the voltage in the second controller.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
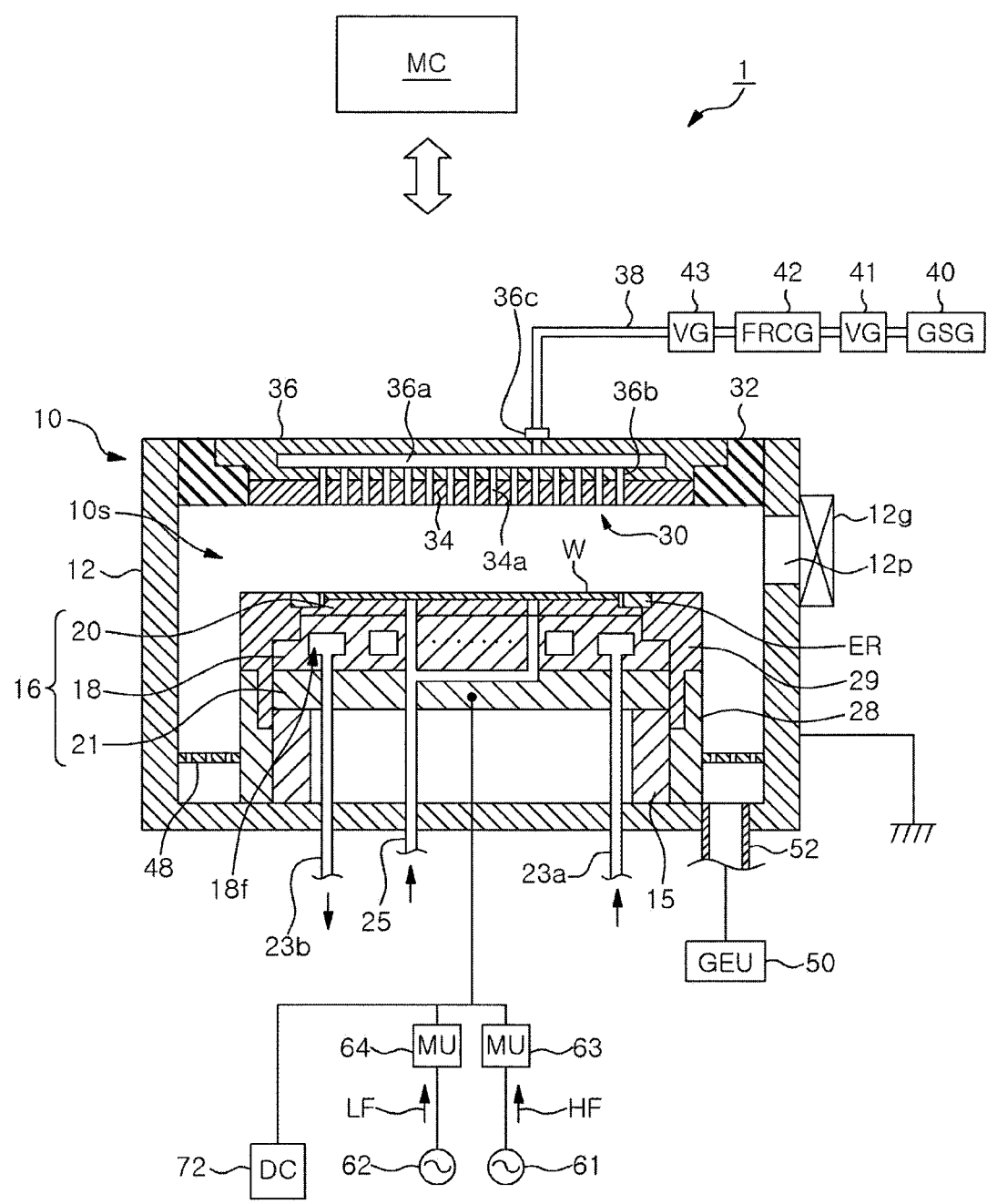
FIG. 1 schematically shows a plasma processing apparatus according to an embodiment.

Hereinafter, embodiments will be described in detail.

In one exemplary embodiment, a plasma processing apparatus is provided. The plasma processing apparatus includes a chamber, a substrate support, a radio frequency power supply, a DC power supply, a first controller, and a second controller. The substrate support includes a lower electrode, an electrostatic chuck, and a heater. The electrostatic chuck is disposed on the lower electrode. The heater that is a resistance heating element disposed in the electrostatic chuck. The radio frequency power supply is electrically connected to the lower electrode. The DC power supply is configured to apply a negative voltage to an edge ring. The edge ring is disposed on the substrate support. The first controller is configured to control the radio frequency power supply and the DC power supply. The second controller is configured to control a power supplied from a heater power supply to the heater such that a difference between a current temperature and a set temperature of the heater is reduced. The first controller controls the radio frequency power supply to supply a pulsed radio frequency power to the lower electrode periodically with a cycle defined by a first frequency, and controls the DC power supply to apply a pulsed negative voltage to the edge ring periodically with the cycle. The second controller is configured to obtain a resistance value of the heater from a sample value of a current supplied to the heater and a sample value of a voltage applied to the heater. The second controller is further configured to control the power by determining the current temperature from the resistance value. The first frequency is different from a second frequency that is a sampling frequency of the sample value of the current and the sample value of the voltage in the second controller.

The lower electrode and the heater in the electrostatic chuck are capacitively coupled. Therefore, when the supply of the pulsed radio frequency power and the application of the pulsed negative voltage are started, a noise current and a noise voltage are instantaneously generated at the heater. In the above-described embodiment, the first frequency and the second frequency are different from each other, so that the start timing of the supply of the pulsed radio frequency power and the application of the pulsed negative voltage are only partially synchronized or not synchronized with the sampling timing of the current and the voltage. Accordingly, the sample value of the current and the sample value of the voltage in which the influence of the noise is suppressed are obtained. In accordance with the above-described embodiment, the resistance value is obtained from the sample value of the current and the sample value of the voltage, and the power is controlled based on the current temperature obtained from the resistance value. Accordingly, the accuracy of the heater temperature control is improved.

In one exemplary embodiment, the first frequency is different from a factor of the second frequency, and the second frequency is different from a factor of the first frequency. With such a configuration, the timing of starting the supply of the pulsed radio-frequency power and the application of the pulsed negative voltage and the timing of sampling the current and the voltage are even less synchronized.

In one exemplary embodiment, the plasma processing apparatus further includes, between the second controller and the heater, a capacitor connected between a pair of lines that electrically connect the heater and the heater power supply.

In one exemplary embodiment, the second controller further includes a current measuring device and a voltage measuring device. The current measuring device is configured to measure the current supplied to the heater. The voltage measuring device is configured to measure the voltage applied to the heater. The heater controller is configured to obtain the resistance value from the sample value of the current measured by the current measuring device and the sample value of the voltage measured by the voltage measuring device.

In one exemplary embodiment, the second controller further includes a switching device. The switching device is connected between the heater and the heater power supply. The heater controller is configured to control the power by controlling a conducting state of the switching device.

In one exemplary embodiment, the heater controller is configured to determine the current temperature using an average value of sequentially obtained resistance values of the heater including the resistance value.

In another exemplary embodiment, a plasma processing method is provided. A plasma processing apparatus used to perform the plasma processing method includes a chamber, a substrate support, a radio frequency power supply, a DC power supply, and a controller. The substrate support includes a lower electrode, an electrostatic chuck, and a heater. The electrostatic chuck is disposed on the lower electrode. The heater that is a resistance heating element disposed in the electrostatic chuck. The radio frequency power supply is electrically connected to the lower electrode. The DC power supply is configured to apply a negative voltage to an edge ring. The edge ring is disposed on the substrate support. The controller is configured to a power supplied from a heater power supply to the heater such that a difference between a current temperature and a set temperature of the heater is reduced. The plasma processing method includes generating plasma in the chamber. In the generating of plasma, a pulsed radio frequency power is supplied from the radio frequency power supply to the lower electrode and a pulsed negative voltage is applied from the DC power supply to the edge ring periodically with a cycle defined by a first frequency in a state where a gas is supplied into the chamber. The plasma processing method further includes controlling the power supplied to the heater by the controller during execution of the generating of plasma. The controller includes a heater controller. In the controlling of the power, the heater controller obtains a resistance value of the heater from a sample value of a current supplied to the heater and a sample value of a voltage applied to the heater. In the controlling of the power, the heater controller controls the power by determining the current temperature from the resistance value. The first frequency is different from a second frequency that is a sampling frequency of the sample value of the current and the sample value of the voltage in the controller.

In one exemplary embodiment, the first frequency may be different from a factor of the second frequency, and the second frequency may be different from a factor of the first frequency.

In one exemplary embodiment, between the controller and the heater, a capacitor may be connected between a pair of lines that electrically connect the heater and the heater power supply.

In one exemplary embodiment, in the controlling of the power, the heater controller may obtain the resistance value from the sample value of the current measured by a current measuring device and the sample value of the voltage measured by a voltage measuring device.

In one exemplary embodiment, in the controlling of the power, the heater controller may control the power by controlling a conducting state of a switching device connected between the heater and the heater power supply.

In one exemplary embodiment, in the controlling of the power, the heater controller determines the current temperature using an average value of sequentially obtained resistance values of the heater including the resistance value.

Hereinafter, various exemplary embodiments will be described in detail with reference to the accompanying drawings. Like reference numerals will be given to like or corresponding parts throughout the drawings.

FIG. 1 schematically shows a plasma processing apparatus according to an exemplary embodiment. A plasma processing apparatus 1 shown in FIG. 1 is a capacitively coupled plasma processing apparatus. The plasma processing apparatus 1 includes a chamber 10. The chamber 10 has an inner space 10s therein.

In the exemplary embodiment, the chamber 10 includes a chamber main body 12. The chamber main body 12 has a substantially cylindrical shape. The inner space 10s is provided in the chamber main body 12. The chamber main body 12 is made of, e.g., aluminum. The chamber main body 12 is electrically grounded. A plasma resistant film is formed on an inner wall surface of the chamber main body 12, i.e., a wall surface that defines the inner space 10s. The plasma resistant film may be a film formed by anodic oxidation treatment or a ceramic film such as a film made of yttrium oxide.

A passage 12p is formed at a sidewall of the chamber main body 12. A substrate W is transferred between the inner space 10s and the outside of the chamber 10 through the passage 12p. A gate valve 12g is disposed along the sidewall of the chamber main body 12 to open and close the passage 12p.

The plasma processing apparatus 1 further includes a substrate support 16. The substrate support 16 is disposed in the chamber 10, i.e., in the inner space 10s. The substrate support 16 is configured to support the substrate W supported thereon. The substrate W may have a disc shape. The substrate support 16 is supported by a supporting part 15. The supporting part 15 extends upward from a bottom portion of the chamber main body 12. The supporting part 15 has a substantially cylindrical shape. The supporting part 15 is made of an insulating material such as quartz.

The substrate support 16 includes a lower electrode 18 and an electrostatic chuck 20. The substrate support 16 may further include an electrode plate 21. The electrode plate 21 is made of a conductive material such as aluminum and has a substantially disc shape. The lower electrode 18 is disposed on the electrode plate 21. The lower electrode 18 is made of a conductive material such as aluminum and has a substantially disc shape. The lower electrode 18 is electrically connected to the electrode plate 21.

A flow path 18f is formed in the lower electrode 18. The flow path 18f is a channel for a heat exchange medium. As an example of the heat exchange medium, a liquid coolant or a coolant (e.g., Freon) for cooling the lower electrode 18 by vaporization of the coolant is used. A supply device (e.g., a chiller unit) for supplying the heat exchange medium is connected to the flow path 18f. The supply device is disposed outside the chamber 10. The heat exchange medium is supplied from the supply device to the flow path 18f through a line 23a. The heat exchange medium supplied to the flow path 18f is returned to the supply device through a line 23b.

The electrostatic chuck 20 is disposed on the lower electrode 18. When the substrate W is processed in the inner space 10s, the substrate W is mounted on and held by the electrostatic chuck 20.

Figure 2:
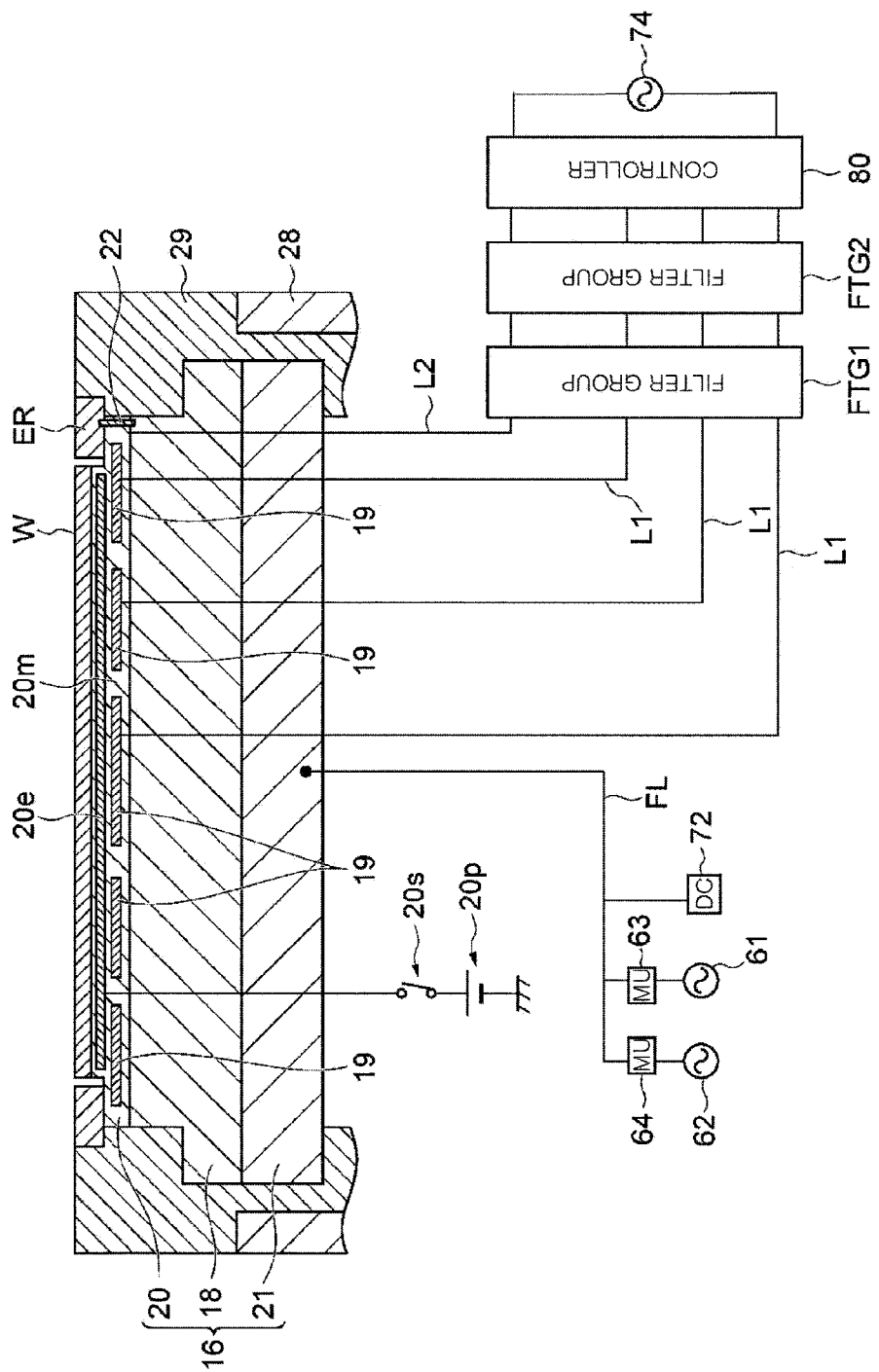
FIG. 2 is a cross-sectional view of a substrate support of the plasma processing apparatus according to the embodiment.

Hereinafter, FIG. 2 will be referred to together with FIG. 1. FIG. 2 is a cross-sectional view of the substrate support of the plasma processing apparatus according to the embodiment. The electrostatic chuck 20 includes a main body 20m and an electrode 20e. The main body 20m is made of a dielectric material. The main body 20m has a substantially disc shape. The electrode 20e has a film shape and is disposed in the main body 20m. A DC power supply 20p is electrically connected to the electrode 20e through a switch 20s. When a DC voltage is applied from the DC power supply 20p to the electrode 20e of the electrostatic chuck 20, an electrostatic attractive force is generated between the electrostatic chuck 20 and the substrate W. Due to the generated electrostatic attractive force, the substrate W is attracted to and held by the electrostatic chuck 20.

The edge ring ER is mounted on the substrate support 16. In the exemplary embodiment, the edge ring ER is mounted on an outer peripheral region of the electrostatic chuck 20. The edge ring ER has a ring shape. The edge ring ER has conductivity. The edge ring ER is made of, e.g., silicon or silicon carbide (SiC). The edge ring ER is electrically connected to the lower electrode 18 through a conductor 22. The edge ring ER surrounds an edge of the substrate W. In other words, the substrate W is disposed on the electrostatic chuck 20 and in a region surrounded by the edge ring ER.

As shown in FIG. 1, the plasma processing apparatus 1 may further include a gas supply line 25. A heat transfer gas, e.g., He gas, is supplied from a gas supply unit through the gas supply line 25 to a gap between an upper surface of the electrostatic chuck 20 and a backside (bottom surface) of the substrate W.

The plasma processing apparatus 1 may further include a tubular member 28 and an insulating member 29. The tubular member 28 extends upward from the bottom portion of the chamber main body 12. The tubular member 28 extends along an outer circumference of the supporting part 15. The tubular member 28 is made of a conductive material and has a substantially cylindrical shape. The tubular member 28 is electrically grounded. The insulating member 29 is disposed on the tubular member 28. The insulating member 29 is made of an insulating material. The insulating member 29 is made of ceramic such as quartz. The insulating member 29 has a substantially cylindrical shape. The insulating member 29 extends along outer circumferences of the electrode plate 21, the lower electrode 18, and the electrostatic chuck 20.

The plasma processing apparatus 1 further includes an upper electrode 30. The upper electrode 30 is disposed above the substrate support 16. The upper electrode 30 blocks an upper opening of the chamber main body 12 in cooperation with a member 32. The member 32 has an insulating property. The upper electrode 30 is held at an upper portion of the chamber main body 12 through the member 32.

The upper electrode 30 includes a ceiling plate 34 and a holder 36. A bottom surface of the ceiling plate 34 defines the inner space 10s. The ceiling plate 34 is provided with a plurality of gas injection holes 34a. The gas injection holes 34a extend through the ceiling plate 34 in a plate thickness direction (vertical direction). The ceiling plate 34 is made of, e.g., silicon, but is not limited thereto. Alternatively, the ceiling plate 34 may have a structure in which a plasma resistant film is formed on a surface of an aluminum base material. The plasma resistant film may be a film formed by anodic oxidation treatment or a ceramic film made of yttrium oxide.

The holder 36 detachably holds the ceiling plate 34. The holder 36 may made of a conductive material such as aluminum. A gas diffusion space 36a is formed in the holder 36. A plurality of gas holes 36b extends downward from the gas diffusion space 36a. The gas holes 36b communicate with the gas injection holes 34a, respectively. A gas inlet port 36c is formed at the holder 36. The gas inlet port 36c is connected to the gas diffusion space 36a. A gas supply line 38 is connected to the gas inlet port 36c.

A gas source group (GSG) 40 is connected to the gas supply line 38 through a valve group (VG) 41, a flow rate controller group (FROG) 42, and a valve group (VG) 43. The gas source group 40, the valve group 41, the flow rate controller group 42, and the valve group 43 constitute a gas supply unit. The gas source group 40 includes a plurality of gas sources. Each of the valve group 41 and the valve group includes a plurality of valves (e.g., opening/closing valves). The flow rate controller group 42 includes a plurality of flow rate controllers. Each of the flow rate controllers of the flow rate controller group 42 is a mass flow controller or a pressure control type flow rate controller. The gas sources of the gas source group 40 are connected to the gas supply line 38 through the corresponding valves of the valve group 41, the corresponding flow rate controllers of the flow rate controller group 42, and the corresponding valves of the valve group 43. The plasma processing apparatus 1 is configured to supply gases from one or more gas sources selected from among the plurality of gas sources of the gas source group 40 to the inner space 10s at individually controlled flow rates.

A baffle plate 48 is disposed between the tubular member 28 and the sidewall of the chamber main body 12. The baffle plate 48 may be formed by coating ceramic such as yttrium oxide on an aluminum base material, for example. A plurality of through-holes is formed in the baffle plate 48. Below the baffle plate 48, a gas exhaust line 52 is connected to the bottom portion of the chamber main body 12. A gas exhaust unit (GEU) 50 is connected to the gas exhaust line 52. The gas exhaust unit 50 includes a pressure controller such as an automatic pressure control valve, and a vacuum pump such as a turbo molecular pump to thereby decrease a pressure in the inner space 10s.

In the exemplary embodiment, the plasma processing apparatus 1 may further include a radio frequency power supply 61. The radio frequency power supply 61 is configured to generate a radio frequency power HF for plasma generation. The radio frequency power HF has a frequency within a range of 27 MHz to 100 MHz, e.g., 40 MHz or 60 MHz. The radio frequency power supply 61 is connected to the lower electrode 18 through a matching unit (MU) 63 and the electrode plate 21 to supply the radio frequency power HF to the lower electrode 18. The matching unit 63 has a matching circuit configured to match an output impedance of the radio frequency power supply 61 and an impedance of a load side (lower electrode 18 side). The radio frequency power supply 61 may not be electrically connected to the lower electrode 18 and may be connected to the upper electrode 30 through the matching unit 63.

The plasma processing apparatus 1 further includes a radio frequency power supply 62. The radio frequency power supply 62 is configured to generate a bias radio frequency power, i.e., a radio frequency power LF, for attracting ions to the substrate W. The frequency of the radio frequency power LF is lower than the frequency of the radio frequency power HF. The frequency of the radio frequency power LF is within a range of 400 kHz to 13.56 MHz, e.g., 400 kHz. The radio frequency power supply 62 is connected to the lower electrode 18 through a matching unit (MU) 64 and the electrode plate 21 to supply the radio frequency power LF to the lower electrode 18. The matching unit 64 has a matching circuit configured to match an output impedance of the radio frequency power supply 62 and the impedance of the load side (the lower electrode 18 side).

In this plasma processing apparatus 1, a gas is supplied to the inner space 10s. Then, one or both of the radio frequency power HF and the radio frequency power LF is supplied to excite the gas in the inner space 10s. Accordingly, plasma is generated in the inner space 10s. The substrate W is processed by chemical species such as ions and/or radicals from the generated plasma.

The plasma processing apparatus 1 further includes a DC power supply 72. The DC power supply 72 is configured to apply a negative voltage to the edge ring ER through the lower electrode 18. By applying the negative voltage from the DC power supply 72 to the edge ring ER, a thickness of a sheath (plasma sheath) above the edge ring ER is adjusted. Accordingly, the incident direction of ions to the edge of the substrate W is adjusted.

The plasma processing apparatus 1 further includes a controller MC (first controller). The controller MC is a computer including a processor, a storage device, an input device, a display device, and the like, and controls the respective components of the plasma processing apparatus 1. Specifically, the controller MC executes a control program stored in the storage device, and controls the respective components of the plasma processing apparatus 1 based on a recipe data stored in the storage device. A process specified by the recipe data can be executed in the plasma processing apparatus 1 under the control of the controller MC. Further, the plasma processing apparatus 1 can perform methods according to various embodiments under the control of the controller MC.

Figure 3:
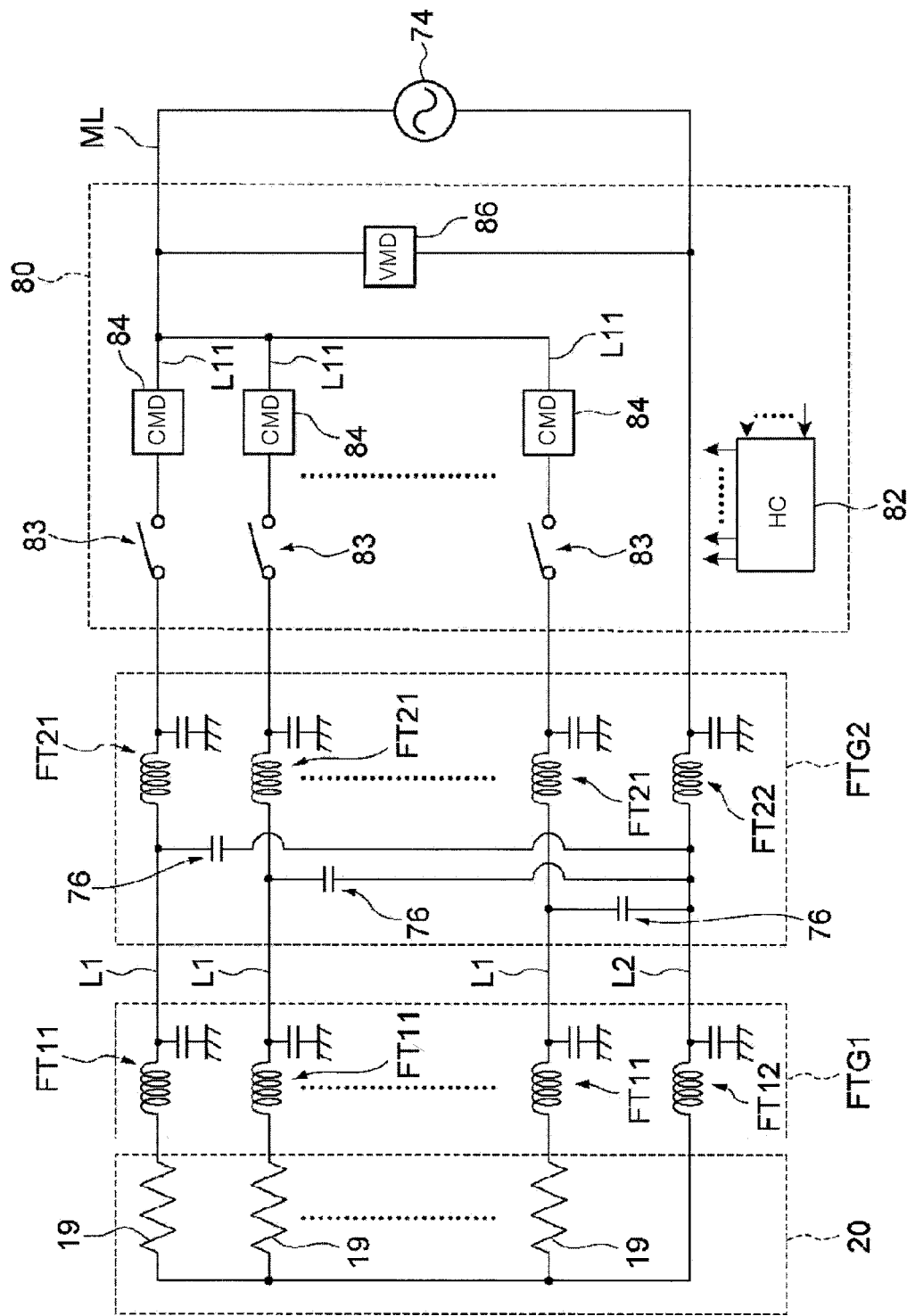
FIG. 3 shows a configuration related to a power supply to a heater and a power control for the heater in the plasma processing apparatus according to the embodiment.
Figure 4:
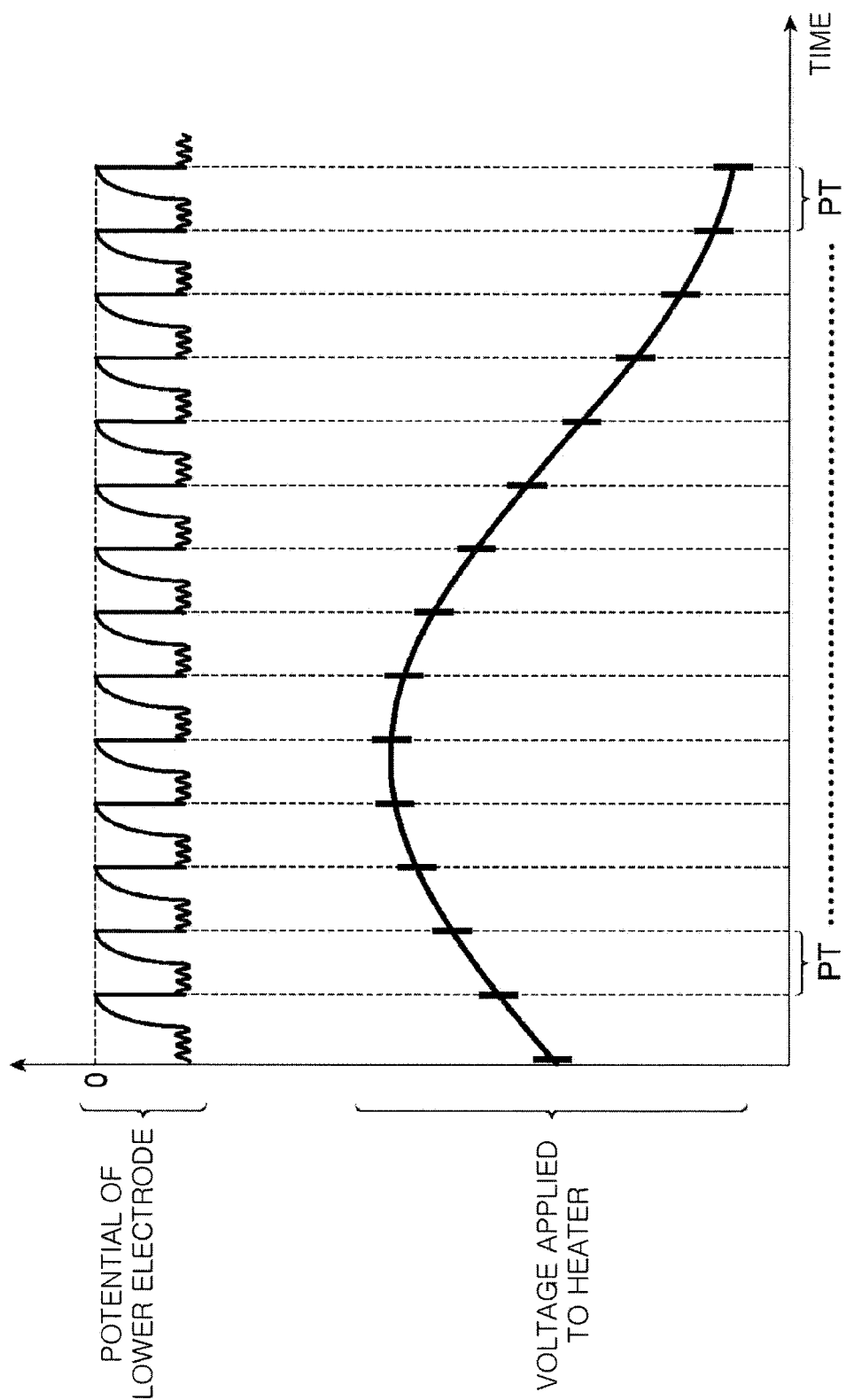
FIG. 4 shows an example of a potential of a lower electrode and an example of a voltage applied to a heater in the plasma processing apparatus shown in FIG. 1.

Hereinafter, FIGS. 3 and 4 will be referred to together with FIGS. 1 and 2. FIG. 3 shows a configuration related to a power supply to a heater and a power control for the heater in the plasma processing apparatus according to the embodiment. FIG. 4 shows an example of a potential of the lower electrode and an example of a voltage applied to the heater in the plasma processing apparatus shown in FIG. 1. In FIG. 4, the horizontal axis indicates time. In FIG. 4, the potential of the lower electrode indicates a potential of a power supply line FL shown in FIG. 2. The power supply line FL is connected to the lower electrode 18 through the electrode plate 21. The radio frequency power supply 61 is connected to the power supply line FL through the matching unit 63. The radio frequency power supply 62 is connected to the power supply line FL through the matching unit 64. Further, the DC power supply 72 is connected to the power supply line FL.

In the plasma processing apparatus 1, in order to generate plasma, the controller MC controls the radio frequency power supply 62 and/or the radio frequency power supply 61 to supply the pulsed radio frequency power LF and/or the pulsed radio frequency power HF to the lower electrode 18 at every cycle PT. The cycle PT is defined by a first frequency f1. In other words, the cycle PT is a reciprocal of the first frequency f1. The radio frequency power LF and/or the radio frequency power HF is supplied to the lower electrode 18 during a first period of the cycle PT. The radio frequency power is not supplied to the lower electrode 18 during a remaining second period of the cycle PT. Alternatively, the level of the radio frequency power supplied in the first period may be reduced in the second period.

Further, the controller MC controls the DC power supply 72 to apply the pulsed negative voltage to the edge ring ER at every cycle PT. In other words, the controller MC controls the DC power supply 72 to apply the pulsed negative voltage to the edge ring ER in synchronization with the supply of the pulsed radio frequency power LF and/or the pulsed radio frequency power HF. In the first period of the cycle PT, the DC power supply 72 applies a negative voltage to the edge ring ER. In the remaining second period of the cycle PT, the application of the negative voltage from the DC power supply to the edge ring ER is stopped. Alternatively, the absolute value of the voltage applied from the DC power supply 72 to the edge ring ER in the second period may be smaller than the absolute value of the voltage applied from the DC power supply 72 to the edge ring ER in the first period.

The control of the radio frequency power supply 62 and/or the radio frequency power supply 61 and the DC power supply 72 by the controller MC causes temporal changes in the potential of the lower electrode 18 as shown in FIG. 4.

As shown in FIGS. 2 and 3, the substrate support 16 further includes one or more heaters 19. In the exemplary embodiment, the substrate support 16 has a plurality of heaters 19. Each of the heaters 19 is a resistance heating element. The heaters 19 are disposed in the electrostatic chuck 20.

Power is supplied from a heater power supply 74 to the heaters 19. The heaters 19 are connected to one or more first lines L1, and are respectively and electrically connected to the heater power supply 74 through the first lines L1. Further, the heaters 19 are electrically connected to the heater power supply 74 through a second line L2. The second line L2 is a common line. In other words, the heaters 19 are electrically connected to the heater power supply 74 through a pair of lines including one corresponding first line L1 and the second line L2.

In the exemplary embodiment, a filter group FTG1 may be disposed between the heaters 19 and the heater power supply 74. The filter group FTG1 includes one or more filters FT11 and a filter FT12. Each of the filters FT11 and the filter FT12 are an LC filter that blocks or attenuates a radio frequency power from a corresponding heater 19 to the heater power supply 74. An inductor of each of the filters FT11 constitutes a part of a corresponding first line L1. A capacitor of each of the filters FT11 is connected between the corresponding first line L1 and the ground. The inductor of the filter FT12 constitutes a part of the second line L2. The capacitor of the filter FT12 is connected between the second line L2 and the ground.

In the exemplary embodiment, a filter group FTG2 may be disposed between the heaters 19 and the heater power supply 74 and further may be disposed between the filter group FTG1 and the heater power supply 74. The filter group FTG2 includes one or more filters FT21 and a filter FT22. Each of the filters FT21 and the filter FT22 are an LC filter that blocks or reduces EMC noise from the corresponding heater 19 to the heater power supply 74. An inductor of each of the filters FT21 constitutes a part of the corresponding first line L1. A capacitor of each of the filters FT21 is connected between the corresponding first line L1 and the ground. The inductor of the filter FT22 constitutes a part of the second line L2. The capacitor of the filter FT22 is connected between the second line L2 and the ground.

In the exemplary embodiment, a capacitor 76 is connected between each of the first lines L1 and the second line L2. In other words, the capacitor 76 is connected between a pair of lines that electrically connect a corresponding heater 19 and the heater power supply 74. One end of the capacitor 76 may be connected to the corresponding first line L1 between the inductor of the corresponding filter FT11 and the inductor of the corresponding filter FT21. The other end of the capacitor 76 may be connected to the second line L2 between the inductor of the filter FT12 and the inductor of the filter FT22.

The plasma processing apparatus 1 further includes a controller 80 (second controller). The controller 80 controls the power supplied from the heater power supply 74 to each of the heaters 19 such that the difference between the current temperature and the set temperature of the corresponding heater 19 is reduced. Hereinafter, the control of the power supplied to one heater 19 by the controller 80 will be described. The control of the power supplied to the other heaters 19 by the controller 80 is performed in the same manner.

The controller 80 has a heater controller (HC) 82. The heater controller 82 includes, e.g., a processor. The heater controller 82 obtains a resistance value of the heater 19 from a sample value of a current supplied to the heater 19 and a sample value of a voltage applied to the heater 19. A sampling frequency of the sample value of the current supplied to the heater 19 and the sample value of the voltage applied to the heater 19 is the second frequency f2. The heater controller 82 determines a current temperature of the heater 19 from the obtained resistance value. The heater controller 82 may determine the current temperature of the heater 19 from the resistance value that is obtained by referring to a table that defines, e.g., the relationship between the resistance value and the temperature. In the exemplary embodiment, the heater controller 82 may be configured to determine the current temperature using an average value of sequentially obtained resistance values of the heater 19. The heater controller 82 controls the amount of power supplied to the heater 19 such that the difference between the determined current temperature and the set temperature is reduced. The control of the power by the heater controller 82 may be the proportional-integral-derivative (PID) control.

In the exemplary embodiment, the controller 80 may further include one or more switching devices 83. Each of the switching devices 83 is connected between a corresponding one of the heaters 19 and the heater power supply 74. When each of the switching devices 83 is in a conducting state, the power is supplied from the heater power supply 74 to the corresponding heaters 19. When each of the switching devices 83 is in a non-conducting state, the power supply from the heater power supply 74 to the corresponding heaters 19 is stopped. The heater controller 82 can control the power supplied to the heaters 19 by controlling the conducting states of the corresponding switching devices 83.

In the exemplary embodiment, the controller 80 may further include one or more current measuring devices (CMD) 84 and a voltage measuring device (VMD) 86. The current measuring devices 84 are configured to respectively measure the currents supplied to the heaters 19 from the heater power supply 74. The voltage measuring device 86 is configured to measure the voltage applied to the heaters 19. The heater controller (HC) 82 obtains the resistance values of the heaters 19 from the sample values of the currents respectively measured by the corresponding current measuring devices 84 and the sample value of the voltage measured by the voltage measuring device 86.

In the exemplary embodiment, the heater power supply 74 is connected to a single line ML. The single line ML is connected to one or more lines L11. The lines L11 are connected to the corresponding switching devices 83. The current measuring devices 84 are configured to measure the currents flowing through the corresponding lines L11. The voltage measuring device 86 is configured to measure the voltage between the line ML and the second line L2.

The above-described second frequency f2 is different from the first frequency f1. In the exemplary embodiment, the first frequency f1 is different from a factor of the second frequency f2, and the second frequency f2 is different from a factor of the first frequency f1. One of the first frequency f1 and the second frequency f2 may be a natural number, and the other frequency may not be a natural number. In one example, the second frequency f2 is 2 kHz, and the first frequency f1 is 2.1 kHz.

In the plasma processing apparatus 1, the lower electrode 18 and the heaters 19 in the electrostatic chuck 20 are capacitively coupled. Therefore, when the supply of the pulsed radio frequency power (LF and/or HF) and the application of the pulsed negative voltage are started, a noise current and a noise voltage are instantaneously generated at each of the heaters 19 (see FIG. 4 showing the application of the voltage to the heaters). In the plasma processing apparatus 1, the first frequency f1 and the second frequency f2 are different from each other. Thus, in the plasma processing apparatus 1, the start timing of the supply of the pulsed radio frequency power (LF and/or HF) and the application of the pulsed negative voltage are only partially synchronized or not synchronized with the sampling timing of the current and the voltage. Accordingly, the heater controller 82 obtains the sample values of the current and the voltage in which the influence of noise is suppressed. In accordance with the plasma processing apparatus 1, the resistance values are obtained from the sample values of the currents and the voltages obtained in the above manner, and the power is controlled based on the current temperatures obtained from such resistance values, which makes it possible to control the temperatures of the respective heaters 19 with high accuracy.

In the exemplary embodiment, as described above, the first frequency f1 is different from a factor of the second frequency f2, and the second frequency f2 is different from a factor of the first frequency f1. In accordance with the present embodiment, the timing of starting the supply of the pulsed radio-frequency power and the application of the pulsed negative voltage and the timing of sampling the current and the voltage are even less synchronized.

Figure 5:
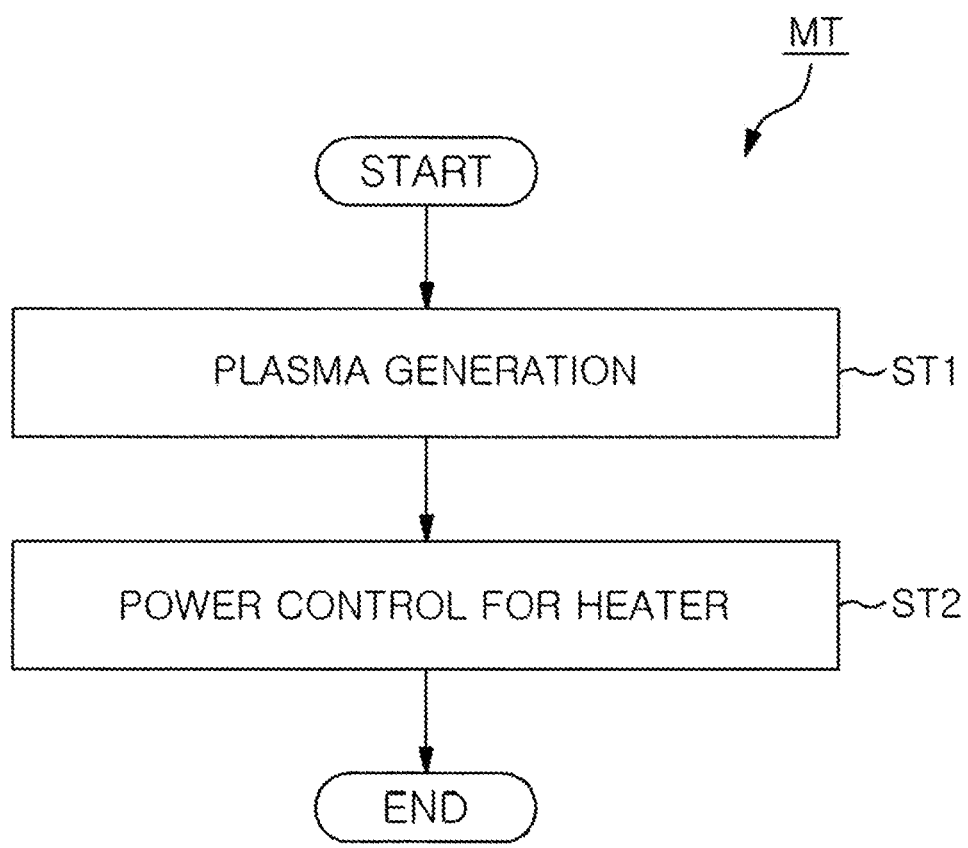
FIG. 5 is a flowchart of a plasma processing method according to an embodiment.

FIG. 5 shows a flowchart of a plasma processing method according to an exemplary embodiment. In the following description, the case of performing the plasma processing method shown in FIG. 5 (hereinafter referred to as "method MT") using the plasma processing apparatus 1 will be described as an example.

In the method MT, step ST1 is executed. In step ST1, plasma is generated in the chamber 10. In step ST1, while a gas is supplied to the chamber 10, the pulsed radio frequency power LF and/or the pulsed radio frequency power HF is supplied from the radio frequency power supply 62 and/or the radio frequency power supply 61 to the lower electrode 18 at every cycle PT. Further, in step ST1, a pulsed negative voltage is applied from the DC power supply 72 to the edge ring ER at every cycle PT. The supply of the pulsed radio frequency power LF and/or the pulsed radio frequency power HF and the application of the pulsed negative voltage to the edge ring ER are synchronized. The cycle PT is defined by the first frequency f1 as described above.

In order to execute step ST1, the controller MC controls the gas supply unit of the plasma processing apparatus 1 to supply the gas into the chamber 10. In order to execute step ST1, the controller MC controls the gas exhaust unit 50 to set the pressure in the chamber 10 to a desired pressure. In order to execute step ST1, the controller MC controls the radio frequency power supply 62 and/or the radio frequency power supply 61 to supply the pulsed radio frequency power LF and/or the pulsed radio frequency power HF. Further, in order to execute step ST1, the controller MC controls the DC power supply 72 to apply the pulsed negative voltage to the edge ring ER.

Step ST2 is executed during the execution of step ST1. In step ST2, the power supplied from the heater power supply 74 to each of the heaters 19 is controlled by the controller 80. Specifically, as described above, the heater controller 82 of the controller 80 obtains the resistance values of the heaters 19 from the sample values of the currents supplied to the heaters 19 and the sample values of the voltages applied to the heaters 19. As described above, the second frequency f2, which is the sampling frequency of the sample value of the current supplied to each of the heaters 19 and the sample value of the voltage applied to the corresponding heater 19, is different from the first frequency f1.

In step ST2, the heater controller 82 determines current temperatures of the heaters 19 from the obtained resistance values, respectively. The current temperatures of the heaters 19 may be determined using an average value of sequentially obtained resistance values, as described above. In step ST2, the heater controller 82 controls the power supplied from the heater power supply 74 to the heaters 19 such that the individual differences between the determined current temperatures and the set temperatures are reduced.

While various embodiments have been described above, various omissions, substitutions, and changes may be made without being limited to the above-described embodiments. Further, other embodiments can be implemented by combining elements in different embodiments.

For example, in another embodiment, the plasma processing apparatus may be any type of a plasma processing apparatus different from the capacitively coupled plasma processing apparatus. For example, an inductively coupled plasma processing apparatus, a plasma processing apparatus for generating plasma using surface waves such as microwaves, or the like, may be used as the plasma processing apparatus.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. A substrate processing apparatus comprising:
   a chamber;
   a substrate support disposed in the chamber, the substrate support including a lower electrode and at least one heater;
   a radio frequency power supply configured to supply a pulsed radio frequency power to the lower electrode, the pulsed radio frequency power having a pulsing frequency;
   a heater power supply configured to supply a power to the at least one heater;
   at least one measuring device configured to sample a current value and a voltage value of the power supplied to the at least one heater, the current value and the voltage value being periodically sampled at a sampling frequency different from the pulsing frequency; and
   a heater controller configured to control the power supplied from the heater power supply to the at least one heater based on the sampled current value and the sampled voltage value.

2. The substrate processing apparatus of claim 1, wherein the pulsing frequency is different from a factor of the sampling frequency, and the sampling frequency is different from a factor of the pulsing frequency.

3. The substrate processing apparatus of claim 1, wherein the pulsing frequency is 2.1 kHz and the sampling frequency is 2 kHz.

4. The substrate processing apparatus of claim 1, further comprising a capacitor connected between the heater controller and the at least one heater.

5. The substrate processing apparatus of claim 1, wherein the at least one measuring device includes a current measuring device and a voltage measuring device.

6. The substrate processing apparatus of claim 1, further comprising at least one switching device connected between the at least one heater and the heater power supply,
   wherein the heater controller is configured to control the at least one switching device.

7. The substrate processing apparatus of claim 1, wherein the heater controller is configured to determine a resistance value from the sampled current value and the sampled voltage value, and control the power supplied from the heater power supply to the at least one heater based on the determined resistance value.

8. The substrate processing apparatus of claim 1, wherein the heater controller is configured to determine resistance values from the periodically sampled current values and the periodically sampled voltage values, respectively, and control the power supplied from the heater power supply to the at least one heater based on an average of the determined resistance values.

9. The substrate processing apparatus of claim 1, wherein the heater controller is configured to determine a temperature of the at least one heater from the sampled current value and the sampled voltage value, and control the power supplied from the heater power supply to the at least one heater based on the determined temperature of the at least one heater.

10. The substrate processing apparatus of claim 1, wherein the heater controller is configured to determine temperatures of the at least one heater from the periodically sampled current values and the periodically sampled voltage values, respectively, and control the power supplied from the heater power supply to the at least one heater based on an average of the determined temperatures.

* * * * *